US006862242B2

United States Patent
Chen

(10) Patent No.: US 6,862,242 B2
(45) Date of Patent: Mar. 1, 2005

(54) SRAM CONTROL CIRCUIT WITH A POWER SAVING FUNCTION

(75) Inventor: Geng-lin Chen, Hsinchu (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 0 days.

(21) Appl. No.: 10/669,530

(22) Filed: Sep. 25, 2003

(65) Prior Publication Data
US 2004/0213069 A1 Oct. 28, 2004

(30) Foreign Application Priority Data
Apr. 25, 2003 (TW) .................................. 92206604 U

(51) Int. Cl.[7] .............................................. G11C 7/00
(52) U.S. Cl. ................... 365/227; 365/226; 365/189.07
(58) Field of Search ................................ 365/227, 226, 365/189.07, 189.05, 189.12

(56) References Cited

U.S. PATENT DOCUMENTS 6,611,473 B2 * 8/2003 Al-Shamma et al. ....... 365/227

* cited by examiner

Primary Examiner—David Lam
(74) Attorney, Agent, or Firm—Bacon & Thomas, PLLC

(57) ABSTRACT

An SRAM control circuit with a power saving function is disclosed, which uses an address comparator to compare a current address and a previous address in an SRAM read operation. When the two addresses are the same, data is outputted directly from a buffer without enabling a memory unit, thereby saving power.

4 Claims, 2 Drawing Sheets

SRAM CONTROL CIRCUIT WITH A POWER SAVING FUNCTION

BACKGROUND OF THE INVENTION

1. Field of the Invention

The present invention relates to a static random access memory (SRAM) control circuit and, more particularly, to an SRAM control circuit with a power saving function.

2. Description of Related Art

In general, memory can be divided into two types, SRAM and DRAM (dynamic access memory). Upon the same chip area, DRAM normally is more than four times the capability of SRAM but SRAM is more than four times the speed of DRAM. In addition, SRAM costs much higher and consumes more power than DRAM. Therefore, for the balance between memory price and performance in computer design, SRAM for use as a cache memory is generally provided between the central processing unit (CPU) and DRAM, thereby providing a cache function.

FIG. 1 is a schematic diagram of a typical SRAM structure. As shown in FIG. 1, an address decoder 10 reads and decodes data on address lines in order to output an address signal to select a specific memory area in a memory unit 14. A chip select signal ~CS enables the memory unit 14 to be read/written in the special memory area. When the chip select signal ~CS and an output enable signal ~OE are active, the memory unit 14 is active to read, and thus data stored in the specific memory area is outputted to an external circuit after being buffered by a buffer 18. When the chip select signal ~CS and a write enable signal ~WE are active, the memory unit 14 is active to write, and thus data inputted by the external circuit to the buffer 18 is written in the specific memory area. All the chip enable signal, the output enable signal and the write enable signal employ the low active mode; i.e., they are active at low level and inactive at high level.

However, in recent years, portable devices are in wide spread use, which require not only the operating speed but also low power consumption. In an example of a general SRAM chip, the entire SRAM chip requires 2 $\mu$A at a standby mode while requiring 20 $\mu$A at an operating mode (during read/write data, namely, chip enable signal at low level). Accordingly, power consumption difference between the two states can be 10,000 times. Therefore, high power consumption in typical SRAM memory can be further improved. Therefore, it is desirable to provide an improved SRAM control circuit to mitigate and/or obviate the aforementioned problems.

SUMMARY OF THE INVENTION

An object of the present invention is to provide an SRAM control circuit with a power saving function, which can reduce power consumption on SRAM read operation.

To achieve the object, there is provided a static random access memory (SRAM) control circuit with a power saving function, which uses a chip select signal, an output enable signal and a write enable signal to control memory read and write, wherein the SRAM control circuit performs a read operation when the chip select signal and the output enable signal are active and performs a write operation when the chip select signal and the write enable signal are active. The SRAM control circuit comprises: a memory unit for storing data; an address decoder for decoding address on address lines and accordingly outputting an address signal to select a specific memory area in the memory unit; a buffer for buffering data to be accessed such that, when performing a read operation, data in the specific memory area is buffered in the buffer to output, and when performing a write operation, inputted data is buffered in the buffer for being written to the specific memory area; an address register for storing a current address signal generated by the address decoder and outputting a previous address signal; an address comparator for comparing the current address signal and the previous address signal; and a mark logic for masking the chip select signal when the current address signal is the same as the previous address signal, wherein the buffer directly outputs buffered data.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
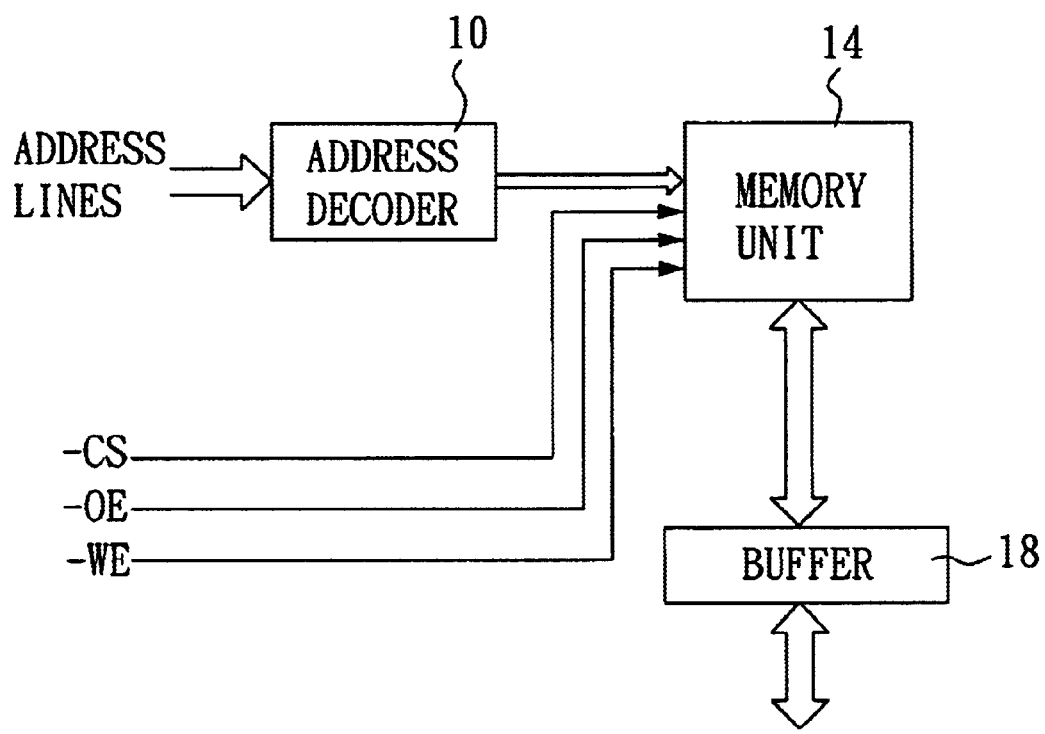
FIG. 1 is a schematic diagram of a typical SRAM structure.
Figure 2:
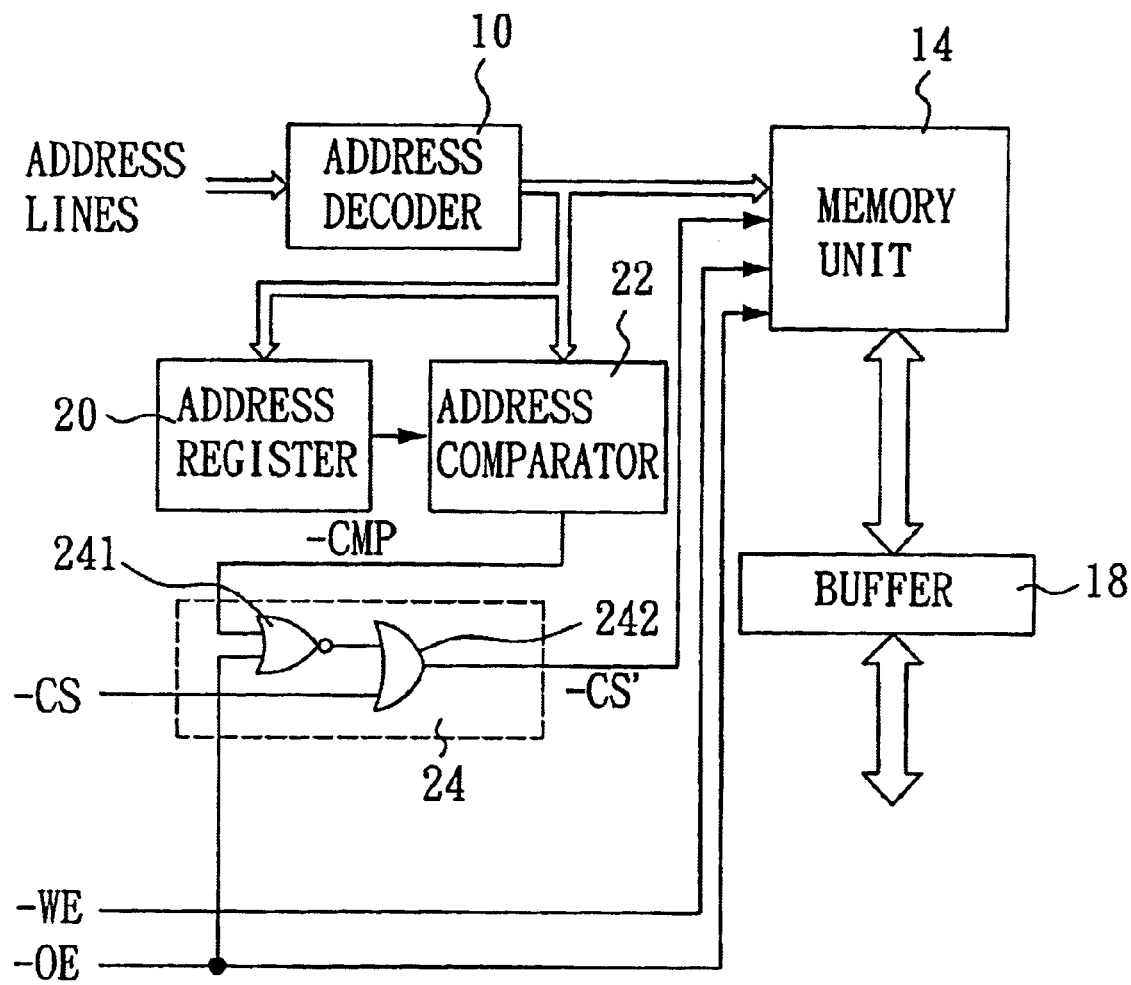
FIG. 2 is a schematic diagram of an SRAM structure in accordance with the present invention.

With reference to FIG. 2, a preferred embodiment of SRAM control circuit with a power saving function in accordance with the present invention is shown, wherein, same as in the prior art, all control signals are active low, i.e., enabled at low level and disabled at high level. As shown in FIG. 2, a read operation is performed when the chip select signal ~CS and the output enable signal ~OE are active (logic 0), and a write operation is performed when the chip select signal ~CS and the write enable signal ~WE are active (logic 0).

As shown in FIG. 2, the inventive SRAM control circuit with a power saving function includes an address decoder 10, an address register 20, an address comparator 22, a memory unit 14, a buffer 18 and a mask logic 24. The address decoder 10 reads the address on address lines and decodes the address to output an address signal to select a specific memory area in the memory unit 14.

The address register 20 stores the current address and outputs a previous address, wherein the previous address is the address for accessing the memory unit 14 at the latest time.

The address comparator 22 inputs the current address and the previous address and compares the two. When the current address is the same as the previous address, it indicates that data in the same address is accessed at successive time and an address comparison signal representing same address (signal ~CMP with low level) is outputted. Otherwise, an address comparison signal representing different address (signal ~CMP with high level) is outputted.

The mask logic 24 is constituted by a NOR gate 241 and an OR gate 242. The NOR gate 241 receives the address comparison signal ~CMP and the output enable signal ~OE to perform a NOR operation and outputs the result of the NOR operation to the OR gate 242. The OR gate 242 performs an OR operation on the result of the NOR operation and the chip select signal ~CS to produce an internal chip select signal ~CS'.

The internal chip select signal ~CS' enables the memory unit 14, so as to read data from or write data to the selected memory area. When the internal chip select signal ~CS' and the output enable signal ~OE are active, a read operation is applied to the memory unit 14, so that data stored in the specific memory area is buffered by the buffer 18 and outputted to an external circuit. When the internal chip select signal ~CS' and the write enable signal ~WE are active, a write operation is applied to the memory unit 14, so that data in the buffer 18 inputted by the external circuit is written into the specific memory area.

With the mask logic 24, when the current memory address to be read and the previous memory address are the same, the address comparison signal ~CMP is at a low level (logic 0), and the output enable signal ~OE is also active (logic 0). Thus, the NOR gate 241 outputs a high level (logic 1). Therefore, the chip select signal ~CS and the internal chip select signal ~CS', generated by the OR gate 242 processing the output of the NOR gate 241, change from active to inactive (logic 1). That is, the mask logic 24 masks the chip select signal ~CS, so as not to enable the memory unit 14. Since the current memory address to be read and the previous memory address are the same, the buffer 18 is still stored with data at previous memory access. Therefore, data in the buffer 18 can be directly output as data to be currently read.

On the other hand, when a write operation is performed or when the current memory address to be read and the previous memory address are different, the mask logic 24 does not mask the chip select signal ~CS, and thus the data read/write process is the same as in the prior art.

In view of the foregoing, it is known that, by comparing the current address with the previous address, the invention masks the chip select signal ~CS when memory address currently to be read is the same as the previous memory address, so as not to enable the memory unit and to read required data directly from the buffer. As compared with the prior memory control circuit, power consumption is reduced because the operation of reading data from the buffer consumes power much lower than from the memory unit.

Although the present invention has been explained in relation to its preferred embodiment, it is to be understood that many other possible modifications and variations can be made without departing from the spirit and scope of the invention as hereinafter claimed.

What is claimed is:

1. A static random access memory (SRAM) control circuit with a power saving function, which uses a chip select signal, an output enable signal and a write enable signal to control memory read and write, wherein the SRAM control circuit performs a read operation when the chip select signal and the output enable signal are active and performs a write operation when the chip select signal and the write enable signal are active, the SRAM control circuit comprising:

a memory unit for storing data;

an address decoder for decoding address on address lines and accordingly outputting an address signal to select a specific memory area in the memory unit;

a buffer for buffering data to be accessed such that, when performing a read operation, data in the specific memory area is buffered in the buffer to output, and when performing a write operation, inputted data is buffered in the buffer for being written to the specific memory area;

an address register for storing a current address signal generated by the address decoder and outputting a previous address signal;

an address comparator for comparing the current address signal and the previous address signal; and a mark logic for masking the chip select signal when the current address signal is the same as the previous address signal, wherein the buffer directly outputs buffered data.

2. The SRAM control circuit as claimed in claim 1, wherein the chip select signal, the output enable signal and the write enable signal are active at a low level and inactive at a high level.

3. The SRAM control circuit as claimed in claim 2, wherein the address comparator outputs a signal with a low level when the current address signal and the previous address signal are the same and otherwise the address comparator outputs a signal with a high level.

4. The SRAM control circuit as claimed in claim 3, wherein the mask logic is constituted by a NOR gate and an OR gate, the NOR gate receiving an output of the address comparator and the output enable signal, the OR gate applying an OR operation to an output of the NOR gate and the chip select signal.

* * * * *